(12) United States Patent
Kruit

(10) Patent No.: US 6,335,783 B1
(45) Date of Patent: Jan. 1, 2002

(54) LITHOGRAPHY SYSTEM

(75) Inventor: Pieter Kruit, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 09/424,575

(22) PCT Filed: May 25, 1998

(86) PCT No.: PCT/NL98/00297

§ 371 Date: Jan. 7, 2000

§ 102(e) Date: Jan. 7, 2000

(87) PCT Pub. No.: WO98/54620

PCT Pub. Date: Dec. 3, 1998

(30) Foreign Application Priority Data

May 26, 1997 (EP) ............................................. 97201595

(51) Int. Cl.[7] ........................ G03B 27/68; G03B 27/54; A61N 5/00
(52) U.S. Cl. .......................... 355/52; 355/67; 250/492.2
(58) Field of Search ........................ 355/53, 55, 67–71, 355/52; 250/492.2, 492.22

(56) References Cited

U.S. PATENT DOCUMENTS 4,724,328 A * 2/1988 Lischke ................... 250/492.2
4,820,927 A * 4/1989 Langner et al. .......... 250/492.2
5,724,122 A * 3/1998 Oskotsky ..................... 285/67

FOREIGN PATENT DOCUMENTS

| GB | 2 164 787 | | 3/1986 |
| GB | 2164787 A | * | 3/1986 |
| GB | 2 260 666 | | 4/1993 |

OTHER PUBLICATIONS

"Ultra–Resolution Image Transfer", *IBM Technical Disclosure Bulletin*, vol. 34, No. 10A, Mar. 1992, pp. 158–162.

* cited by examiner

*Primary Examiner*—Russell Adams
*Assistant Examiner*—Hung Henry Nguyen
(74) *Attorney, Agent, or Firm*—Young & Thompson

(57) ABSTRACT

A lithography system includes a light source producing a light beam directed to a mask located in a mask level and an optical demagnifier for demagnifying by a factor and focusing the beam. The light beam is focused on a converter element for converting the beam in a further beam having a smaller wavelength than UV light. The beam at the mask level has a transversal size smaller than the desired resolution at the object level multiplied by the demagnifying factor.

18 Claims, 2 Drawing Sheets

LITHOGRAPHY SYSTEM

BACKGROUND OF THE INVENTION

The invention relates to a lithography system comprising a light source producing a light beam directed to a mask located in a mask level and an optical demagnifier for demagnifying and focusing the beam.

Such a system is for example known from the article "Optics for Wafer Steppers: The Key to the Semiconductor Industry" published in "Innovation 1, Carl Zeiss, 1996, pages 32 and 33.

In said article a wafer stepper is described using high-quality projection lenses to project a 4× demagnified image of a device pattern on a mask (the reticle) in a step and repeat fashion onto a silicon wafer. Starting as machines for 1.5 $\mu$m resolution in the late seventies a 4× Deep UV steppers with 0.25 $\mu$m resolution are now offered by several manufacturers. By decreasing the wavelength to 193 nm, it is expected that the 0.18 generation and probably also the 0.13 generation microcircuits could be written with the known technology.

Furthermore, in GB-A-2.164.787 and GB-A-2.260.666 a lithographic system is described, comprising a light source, a mask, a demagnifying lens and a photocathode, onto which a demagnified image of the mask is focused. The photocathode converts the light beam into a further beam of particles, in particular an electron beam. This electron beam is focused onto the object to be lithographed.

SUMMARY OF THE INVENTION

The invention has the object to provide a lithography system of the abovementioned kind, by which a resolution of less than 0.1 $\mu$m could be obtained.

According to the invention, the abovementioned object is achieved in that the light beam is focused on a converter element for converting said beam in a beam having a smaller wavelength than UV light. Preferable the converter element converts the light beam in a beam of particles. However, the inventor has found that a resolution of less than 0.1 $\mu$m could not be obtained, if the mask is imaged as a whole on the object to be lithographed such as in prior art systems. Only by illuminating the mask with a light beamlet which has at the mask level a transversal size smaller than the desired resolution at the object level multiplied by the demagnifying factor and scanning pixel by pixel the mask and consequently the object to be lithographed, the inventor has obtained a resolution of less than 0.1 $\mu$m. It appeared that the reason of said success was the scanning operation. The image of the mask is as it were divided in pixels.

Preferably, the light source produces a plurality of light beamlets and a converter plate is provided with a plurality of converter elements, wherein the light source and converter plate are arranged such that each light beamlet is focused on one converter element. Each beamlet coming from the converter element is apertured or, alternatively, demagnified to sharpen up the pixels to less than 0.1 $\mu$m.

It is notified, that from the European Patent Application EP-0605964 A3 a converter plate in form of a patterned photocathode is known per se. The photocathode lays the role of the mask according to which a wafer is lithographed. However, this technique has serious mask problems because it is a 1:1 mask and this technique is very sensitive to contamination of the photocathode. This technique is also disclosed in the European Patent Application EP-0321147 A2, the Japanese Abstract 55-87432 (A) Application nr. 53-163151 and the article "A 1:1 Electron Stepper" by R. Ward et al, published in 8257B Journal of Vacuum Science & Technology B, 4 (1986) January–February, No. 1, Second Series, New York.

Most other forms of high throughput electron beam lithography (shaped beam, Gaussian beam, cell projection, mask projection) are ultimately limited by stochastic Coulomb interactions between individual electrons in the beam.

From "IBM Technical Disclosure Bulletin", vol. 36, No. 08, August 1993, page 379 a high throughput high resolution electron beam lithography system is known per se. This system uses the technique of multi-micro-column lithography, in which individual electron beams are focused on a wafer. However, the question of how to control such a large number of mini columns has not yet been answered.

BRIEF DESCRIPTION OF THE DRAWINGS

The invention will be explained by reference to the drawings, in which.

DESCRIPTION OF THE PREFERRED EMBODIMENTS

Figure 1:
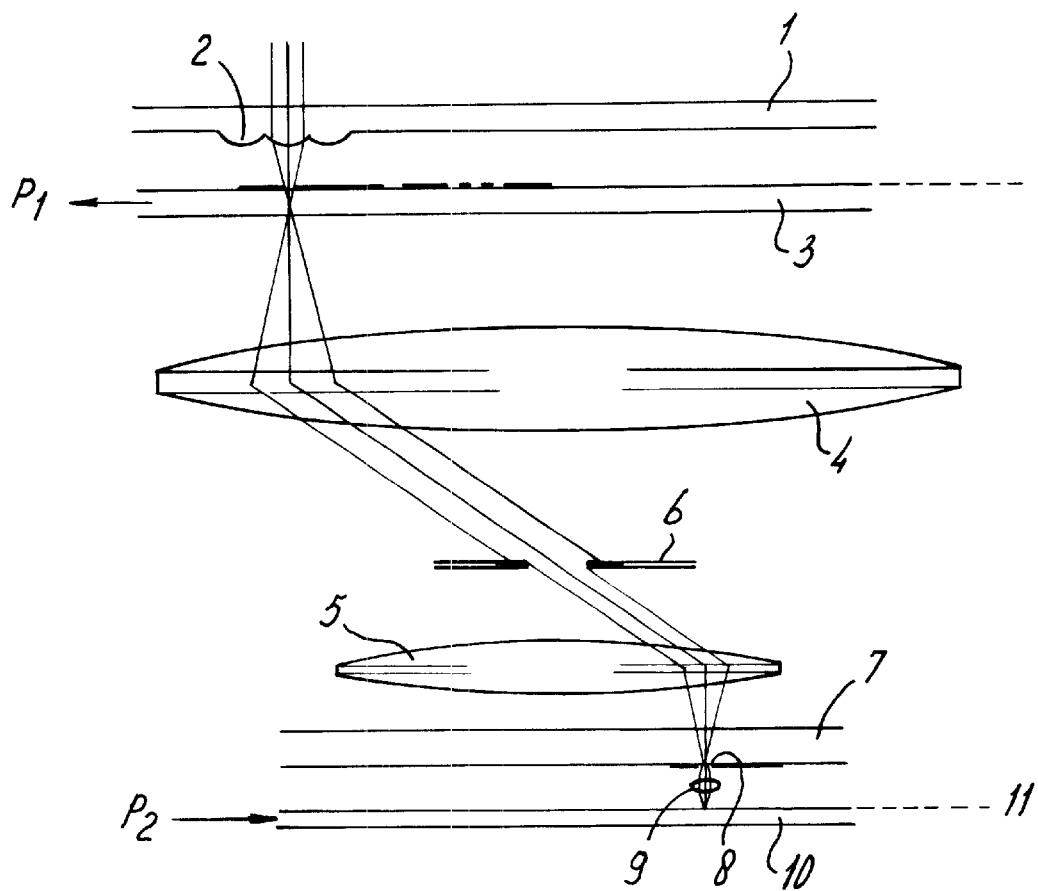
FIG. 1 shows schematically an embodiment of the lithography system according to the invention.

Imagine that we have a known deep-UV lithography tool for the 0.13 $\mu$m generation in which we put a "traditional" 4× mask for obtaining the 0.1 $\mu$m generation. At the wafer, each 0.4 $\mu$m "pixel" of the mask is focused to a spot of 0.13 $\mu$m. Since the distance between pixels at the wafer must be 0.1 $\mu$m, there is a mixing of information between neighbouring pixels because the spots of 0.13 $\mu$m overlap each other. If we could sharpen up the 0.13 $\mu$m spot, this machine would be ready for the 0.1 generation. The sharpening up, or enhancement of resolution, cannot be done after the mixing of information has occurred.

According to the invention only one pixel of the mask is illuminated. Then there would only be an isolated spot of 0.13 $\mu$m at the imaginary wafer plane. At the location of said spot a converter element, for example in the form of a photocathode of size 0.1 $\mu$m, or rather, a photocathode with a metallic aperture of diameter 0.1 $\mu$m on top is positioned. The electron source of diameter 0.1 $\mu$m that is obtained in this way is now imaged with magnification 1 onto a wafer in the real wafer plane spaced from the photocathode. This can be done either with acceleration inside a magnetic field or with a small accelerating electrostatic lens. The next step is to move the mask 0.4 $\mu$m in order to illuminate the adjacent pixel on the mask while, at the same time, moving the wafer 0.1 $\mu$m in order to have the adjacent pixel on the wafer written. In such a way, the mask pattern is transferred to the wafer with the required resolution. It would take a long time to write a whole wafer with this one beam. However, the principle is the same when many pixels are written simultaneously. In theory the distance between beams at the wafer needs only to be as much as the point spread function. In practice, certainly when electrostatic focusing is used, the fabrication technology of the photocathode/lens array will determine the minimum distance. The number of beams should be in the order of $10^6$–$10^8$.

Such a multiple beamlet embodiment of the invention is shown in FIG. 1. A light source not shown produces a light beam (deep UV) impinging on a micro lens array 1 having lenses 2. The light beam is as it were divided in beamlets, of which only one is shown for the sake of clearness. The lens 2 focuses the beamlet on the mask 3. Each light beamlet leaving the mask 3 passes a demagnifier, which is schematically indicated by the lenses 4 and 5 and the aperture 6. By the demagnifier the beamlets are focused on the converter plate 7 having converter elements 8 of which only one is indicated. If the converter plate 7 is constituted by a photocathode having a plurality of apertures an electron beamlet is originated from each aperture and passes through focusing means, indicated schematically by the lens 9. Finally the electron beamlet impinges on the wafer 10 in the wafer plane 11.

Figure 2:
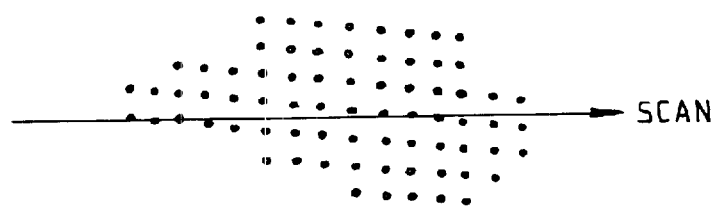
FIG. 2 illustrates the scanning direction of the pixels on a wafer to be lithographed.

The mask 3 is moved according to the arrow P1 and the wafer according to arrow P2. If the mask is moved 0.4 $\mu$m the wafer must be shifted 0.1 $\mu$m. The pixels could be arranged at random on the wafer. In the embodiment of FIG. 2 the pixels are arranged in lines and columns and the scanning direction SCAN differs from the direction of the lines of pixels.

As the resolution is now enhanced by sharpening up pixel by pixel, using a photocathode with very many apertures, it is proposed to call this technology "Multiple Aperture Pixel by Pixel Enhancement of Resolution" or "MAPPER" technology. It can be thought of as traditional projection lithography in which the mask information is split up and transferred to the wafer sequentially. It can also be thought of as multiple micro-column lithography in which the electron sources are blanked by the mask.

Writing Strategy

In the basic principle of the MAPPER technology, each pixel on the wafer could be written by one electron beamlet, as in traditional Gaussian beam electron lithography. Every electron beamlet would then write a small local area, for instance a square or a line. However, this writing strategy would set extreme demands on the homogeneity of the photocathode, the size of the apertures, the stitching between local areas, etc. One malfunctioning beamlet would be catastrophic, a small variation in beam current would result in "darker" or "lighter" patches, and a small misplacement of one aperture would shift a whole patch resulting in double exposed and unexposed lines.

The ideal writing strategy allows for local variations of cathode efficiency or even totally dead beamlet sources. The latter can only be allowed if every pixel is written by very many different beamlets, in other words, there must be a high level of redundancy. For a 2% homogeneity of illumination, the redundancy must be at least 50, say 100. The number of electrons per pixel will probably be in the order of a few thousands, so every beamlet source deposits a few dozen electrons onto one pixel.

The result of the scanning strategy is that the resolution at the wafer is a convolution of the illumination resolution (divided by 4) and the electron beamlet size.

The illumination field is determined by the UV optics. The field in a present day scan-and-step system is about 5×20 mm with a scan in the direction of the short axis. Assume that this will be the same for the MAPPER—a scan in only one direction - then the step-and-go movements of the stage are minimized. In a 5 mm scan, each pixel must be illuminated by 100 beamlets. The linear distance between beamlets will then be 50 $\mu$m. So, for a redundancy of 100, there must be one beamlet on every 5 $\mu$m$^2$. On a square grid, the nearest neighbour distance will be about 2 $\mu$m, on a hexagonal grid slightly larger.

For a field of 5×20 mm the number of beamlets is about 2×10$^7$, but the redundancy strategy is very lenient with respect to random variations in quality.

The Electron System

The electron sources are small dots of photocathode material deposited on a UV transparent substrate. Between the photocathodes there is a light absorbing material. Depending on the available UV power, one can choose to use a gold or even platinum photocathode or a high efficiency cathode such as CsI. Gold will emit electrons when illuminated by light of wave length smaller than 260 mm (Platinum at $\lambda$<217 mm), but with an efficiency of only about $10^{-4}$ electrons per photon. Generally used photocathodes like CsI or Cs$_3$Sb have efficiencies of more than $10^{-2}$, but are sensitive to contamination.

The electron acceleration voltage in traditional electron beam lithography is 20 kV, recently often increased to 50 or 100 kV. Many experimental machines have an acceleration voltage of about 1 kV. For a single beam machine 1 kV has the disadvantage of giving lower currents in the beam, but that is not a problem here. There are three advantages of 1 kV over 50 kV: technologically more simple, no charging of insulator materials because the secondary emission coefficient is equal to 1 and smaller proximity effects. The disadvantage is the absorption of all, the energy in the top layer of the resist, necessitating a thin resist or advanced processing.

Figure 3:
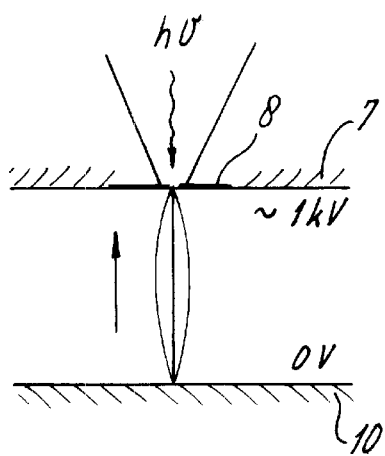
FIG. 3 schematically shows a part of a converter plate in form of a photocathode according to the invention.

The 1:1 photocathode image projector used magnetic focusing. Using magnetic focusing also for the MAPPER (see FIG. 3) would make the production of the photocathode relatively simple, but asks for either an enormous coil to immerge the whole instrument in a magnetic field, or space close to the photocathode to make a local field. For a cathode-wafer distance of about 1 mm, and acceleration to 1 keV the magnetic field must be about 0.5 T.

Figure 4:
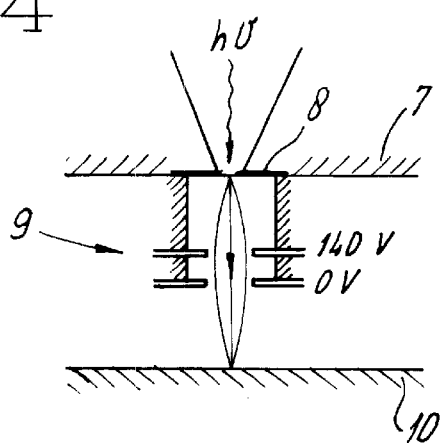
FIG. 4 shows a part of another embodiment of the converter plate according to the Invention.

In the 1:1 photocathode electrostatic imaging was impossible, but in the MAPPER it might be the preferred solution (see FIG. 4). Each photocathode source must have its own miniature lens of the type pioneered for field emission arrays. A typical lens would consist of two 1 $\mu$m apertures at distances of about 100 $\mu$m, resp. 200 $\mu$m from the photocathode. A voltage of 140 V on the first aperture and 1 kV on the second gives a focus at 450 $\mu$m distance from the cathode, with a magnification of 1.

Mask Illumination The mask must be illuminated by an array of $10^6$–$10^8$ dots. That this is possible in principle can best be seen by imagining a 1:1 deep UV lithography instrument which projects an aperture plate with 0.4 $\mu$m apertures onto the mask. In a practical instrument this particular solution would have the disadvantage of throwing away most of the UV power.

If a homogeneous, parallel UV beam is sent through an array of micro lenses, it will split up in subbeams. Each subbeam forms a focus which can either fall directly on the mask or be imaged with a 1:1 system. Taking the typical distance between electron beamlets of 2 $\mu$m (see section writing strategy) and multiplying it by M=4, we will find out that the diameter of the micro lenses is about 8 $\mu$m. The distance between the lensplane and the focus plane is then also about 8 $\mu$m. This is dangerously close if the mask is positioned in the focus plane and must be moving with respect to the microlens array. It seems preferable to image the micro focus plane with a conventional 1:1 projector on to the mask. Given sufficient coherence and sufficient regularity of the micro lenses, it might also be possible to create a periodic focusing situation. The mask can then be situated in one of the far-off Fourier-images of the microlens array, possibly at a distance of a few tenths of a millimetre.

There must be a correspondence between the position of the individual converter elements and the UV focus positions on the mask. Because one pixel on the wafer is illuminated through many microlens-converter element source combinations, random position errors effect the resolution, as long as the electron source stays within the point spread function of the UV. When it goes outside, the efficiency decreases.

It seems best to manufacture the converter element array and the UV-microlens array in a process resembling the mask-fluorescent screen manufacturing in TV-tubes. If one of the two arrays is made first and subsequently used to define the other array the position of individual lenses is almost unimportant, could in theory even be random. The 1:1 projection of the micro focus array on to the mask does not need to be distortion free: the manufacture procedure automatically predistorts the lens array.

Other Variations

Each electrostatic microlens could form a demagnified image of the photocathode. In this case there would be no need for apertures on the photocathode because the demagnified image of the UV point spread function is sufficiently small. The manufacturing problem would be limited to making two plates with 1 $\mu$m holes.

Figure 5:
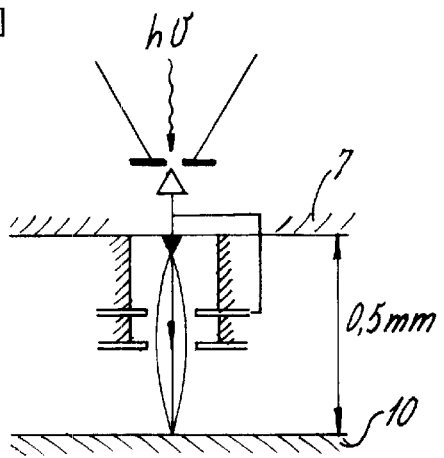
FIG. 5 indicates a part of a further embodiment of the converter plate according to the invention.

The photocathode could be replaced by an array of field emitters or pn emitters. However, now each emitter must have a circuit switching on the emission when UV light falls on a detector (see FIG. 5).

For special applications the photocathode could also be illuminated with a scanning laser beam.

The photocathode could be replaced by an array of light-switched ion sources, for instance a gas between a glass plate and an aperture plate.

The converter plate could be constituted by a layer of fluorescent material, which emits light after two photon excitation. One photon comes from the projection of the mask, the other from a flood illumination. The emitted photons, in the deeper UV than 193 nm, then only need to pass through very thin micro lenses so that absorption is limited, compared to a system where the UV has to pass through the whole illumination and projection system.

What is claimed is:

1. A lithography system comprising:
    a light source producing a light beam directed to a mask;
    means for scanning the beam over the mask;
    an optical demagnifier for demagnifying by a factor and focusing the beam;
    a converter element on which the light beam is focused for converting said beam into a further beam of particles; and
    means for focusing the further beam at a focal point, in which an object to be lithographed is supported such that the focal point is on the object surface,
    wherein the beam at the mask has a transversal size smaller than a size of the further beam at said focal point that is 0.1 $\mu$m or smaller, multiplied by the demagnifying factor.

2. The lithography system according to claim 1, wherein at a side facing the object, the converter element is provided with an aperture, the dimension of which is smaller than 0.1 $\mu$m.

3. The lithography system according to claim 1, wherein the light source produces a plurality of light beamlets and further comprising a converter plate provided with a plurality of the converter elements arranged such that each of the light beamlets is focused on a respective one of the converter elements.

4. The lithography system according to claim 3, wherein for full illumination of the mask both the mask and the object are moved with respect to the light beamlets and the converter plate or vice versa such that the image of the mask on the object is stable.

5. The lithography system according to claim 3, wherein the light source is provided with a microlens array comprising a plurality of microlenses for dividing a light beam into said plurality of light beamlets.

6. The lithography system according to claim 5, further comprising an optical projection system for positioning the focus of each of the beamlets from each said microlens on the mask.

7. The lithography system according to claim 3, wherein the converter elements are arranged at random.

8. The lithography system according to claim 3, wherein the converter elements are arranged in lines and columns.

9. The lithography system according to claim 8, wherein the direction of scanning the object to be lithographed differs from the line direction of the converter elements.

10. The lithography system according to claim 3, wherein the converter element is a field emitter or a pn emitter that is individually controlled by a light switch on which the beamlets impinge.

11. The lithography system according to claim 1, wherein one object pixel is illuminated sequentially by a plurality of beamlets.

12. The lithography system according to claim 1, wherein the converter element is a photon-electron converter.

13. The lithography system according to claim 12, further comprising a magnetic field for focusing the further beam originating from the converter element.

14. The lithography system according to claim 1, wherein the converter element is a photon-ion converter.

15. The lithography system according to claim 12, further comprising electrostatic field lenses for focusing the further beam originating from the converter element.

16. The lithography system according to claim 15, wherein the electrostatic field lenses are located between the converter element and the level of the object to be lithographed.

17. The lithography system according to claim 1, wherein the converter element is a photon-photon converter.

18. A lithography system, comprising:
    a light source that produces a plurality of beamlets that are each smaller in transverse size than a product of a demagnification factor times 0.1 $\mu$m, the beamlets being directed towards a mask;
    an optical demagnifier for demagnifying the beamlets by the demagnification factor after passage through the mask;
    plural converter elements that receive the demagnified beamlets and produce further beams of particles; and
    a focusing device that focuses the further beams of particles at respective focal points on an object to be lithographed, each of the focal points being no more 0.1 $\mu$m in transverse size.

* * * * *